United States Patent [19]

Fox et al.

[11] Patent Number: 4,943,761
[45] Date of Patent: Jul. 24, 1990

[54] CURRENT LIMITED DC POWER CONTROLLER

[75] Inventors: David A. Fox; William W. Billings, both of Lima, Ohio

[73] Assignee: Westinghouse Electric Corp., Pittsburgh, Pa.

[21] Appl. No.: 215,694

[22] Filed: Jul. 6, 1988

[51] Int. Cl.$^5$ .............................................. G05F 1/56
[52] U.S. Cl. .................................... 323/283; 323/285
[58] Field of Search ............... 323/282, 283, 284, 285; 361/18, 87, 93, 100, 101

[56] References Cited

U.S. PATENT DOCUMENTS

| | | | |
|---|---|---|---|
| 3,697,813 | 10/1972 | Fox | 361/98 |
| 3,697,860 | 10/1972 | Baker | 323/271 |
| 3,710,231 | 1/1973 | Baker | 323/290 |
| 3,719,873 | 3/1973 | Graf | 318/198 |
| 3,766,409 | 10/1973 | Shuey | 307/646 |
| 3,879,652 | 4/1975 | Billings | 323/322 X |
| 3,925,709 | 12/1975 | Mitchell et al. | 361/100 |
| 4,008,418 | 2/1977 | Murphy | 361/18 |
| 4,086,503 | 4/1978 | Fox et al. | 307/363 |
| 4,245,184 | 1/1981 | Billings et al. | 323/235 |
| 4,346,424 | 8/1982 | Hansen | 361/94 |
| 4,368,420 | 1/1983 | Kuo | 323/281 X |
| 4,371,824 | 2/1983 | Gritter | 363/56 X |
| 4,404,473 | 9/1983 | Fox | 323/274 X |
| 4,438,498 | 3/1984 | Sekel et al. | 323/283 X |
| 4,453,089 | 6/1984 | Shuey et al. | 307/253 |
| 4,616,301 | 10/1986 | Small | 363/26 |
| 4,668,905 | 5/1987 | Schierjott | 323/287 |
| 4,686,617 | 8/1987 | Colton | 363/56 |
| 4,725,769 | 2/1988 | Cini et al. | 323/283 |

Primary Examiner—Patrick R. Salce
Assistant Examiner—Kristine Peckman
Attorney, Agent, or Firm—R. P. Lenart

[57] ABSTRACT

A current limited DC power controller is provided with an output stage having a controllable solid state switching device for conducting current between a pair of output terminals and a drive circuit for controlling the operation of this switching device in response to a control signal. A programmable current source is used to produce a reference current signal in response to a command signal and this reference current signal passes through a resistor to produce a reference voltage signal having a magnitude proportional to the command signal. When the power controller is off, the reference voltage signal is clamped to a preselected value. A second voltage signal proportional to the load current is combined with the referenced voltage signal and used to produce the control signal to which the drive circuit responds.

7 Claims, 1 Drawing Sheet

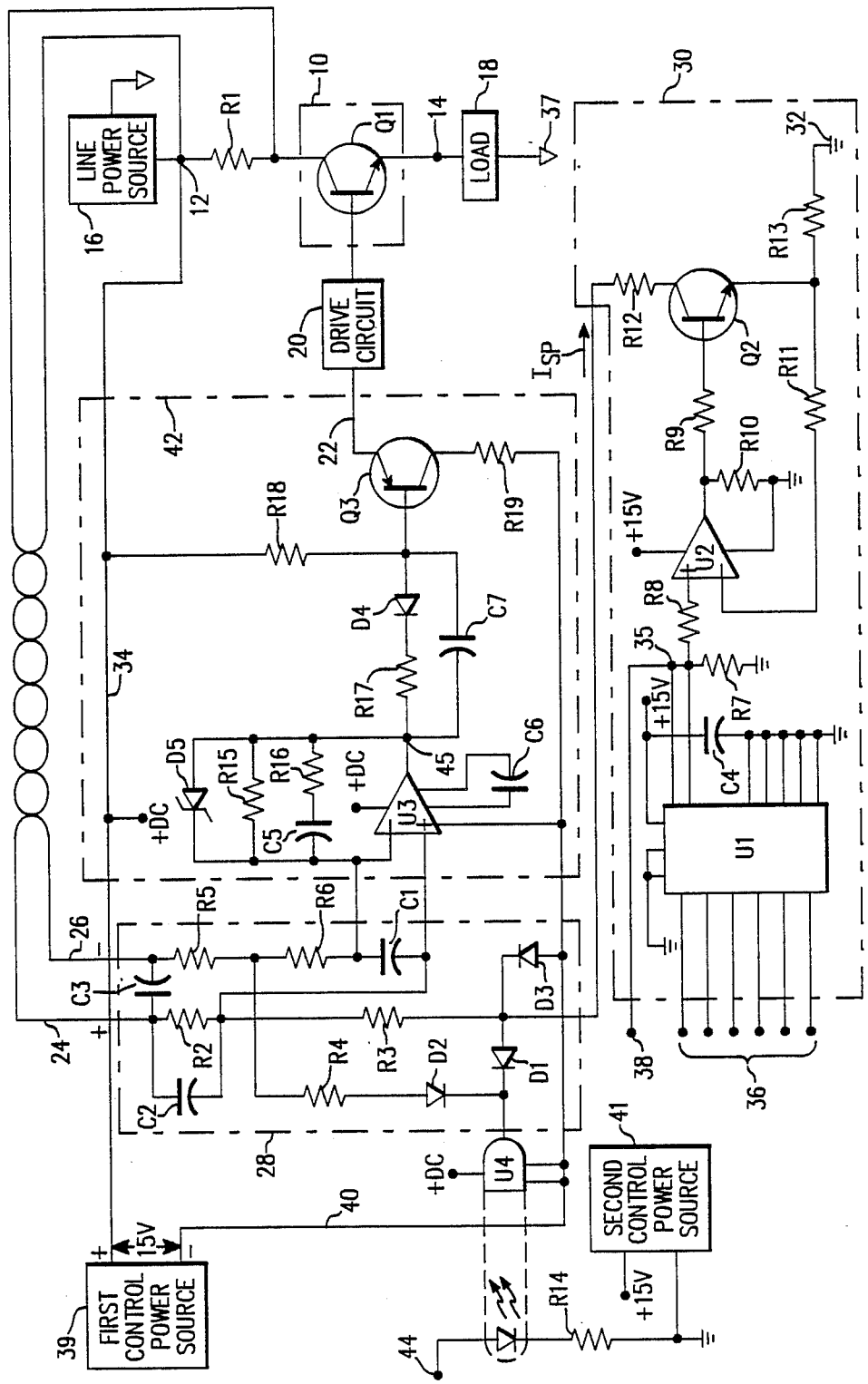

CURRENT LIMITED DC POWER CONTROLLER

BACKGROUND OF THE INVENTION

This invention relates to DC power controllers and, more particularly, to current limited DC power controllers.

High voltage DC power systems for advanced aircraft and spacecraft require current limiting power controllers to protect the power source, loads and wiring. During a short circuit, full line voltage appears across the switch element of a power controller while it is limiting current to a safe value. Circuit techniques suitable for low voltage DC systems, such as 28 volts DC, are not satisfactory at higher voltages such as 150 or 200 volts DC. At the higher levels, transistor safe operating area curves are severely limited. A large transistor capable of carrying 150 amperes DC continuously with a forward voltage drop of one volt DC may be capable of supporting 150 volts DC at the same current level for only 100 microseconds. Under such operating criteria, current limiting control must be fast and accurate to prevent destruction of the switch element.

Advanced electrical power systems also require power controllers with programmable ratings. Programmable power controllers reduce inventory costs and allow reconfiguration of the electrical system to support different missions, to conform to limitations in power sources, and to operate under damage conditions.

SUMMARY OF THE INVENTION

This invention seeks to provide a programmable power controller suitable for use in higher voltage DC systems which includes fast, accurate current limiting. Power controllers constructed in accordance with this invention include an output circuit stage having a controllable solid state switching device for conducting current between a pair of output terminals and a drive circuit for controlling the switching device in response to a control signal. A programmable current source is used to produce a reference current signal in response to a command signal input. A resistor, connected in series between a line voltage source and the programmable current source, produces a reference voltage signal having a magnitude proportional to the command signal. When the power controller is off, the reference voltage signal is clamped to a preselected magnitude. A second voltage signal, having a magnitude proportional to the current flowing through the output stage of the power controller, is combined with the reference voltage signal to produce a difference signal. The control signal needed by the drive circuit is produced in response to this difference signal.

The current limiting features of this invention are compatible with various DC power switch circuits. A programmable current limit set point may be controlled by various types of analog or digital input signals. Rise and fall times of the output stage switching device are controlled by circuit element time constants. This permits a fast response time to overloads and limits current overshoot in the output stage.

BRIEF DESCRIPTION OF THE DRAWING

The single FIGURE is a schematic diagram of the preferred embodiment of a current limited DC power controller constructed in accordance with this invention.

DESCRIPTION OF THE PREFERRED EMBODIMENT

Referring to the drawing, current limited DC power controllers constructed in accordance with this invention include an output circuit stage 10 having a controllable solid state switching device in the form of transistor Q1, for conducting current between a pair of output terminals 12 and 14. When connected in a power system, a line power source 16 is connected to one of the output terminals and a load 18 is connected to the opposite output terminal. A drive circuit 20, constructed in accordance with known techniques controls the operation of transistor Q1 in accordance with a control signal produced on line 22. When transistor Q1 is conducting, load current flows through resistive shunt R1 thereby producing a voltage signal on lines 24 and 26, which has a magnitude proportional to current flowing through the output stage of the power controller. A bridge circuit 28 comprising resistors R2, R3, R5 and R6, capacitors C1, C2, and C3 and diodes D1, D2, D3, combines the voltage signal on lines 24 and 26 with a reference voltage, corresponding to a current limit setpoint, to produce a difference signal across capacitor C1. A programmable current source 30 is electrically connected in series with resistor R2, such that the reference voltage signal appears across R2 in response to the constant current provided by programmable current source 30. The current source provides signal coupling from a control ground connection 32 to a high voltage line 34, which may be at a potential of, for example, 150 or 200 volts DC. The current limiting set point is controlled by a voltage produced at point 35 by an analog-to-digital converter U1. A digital command signal supplied on input conductors 36 is converted to a DC voltage in the range of 0 to 10 volts DC at point 35. The DC setpoint signal is echoed back to terminal 38 so that proper operation of the analog-to-digital converter can be confirmed. The additional components of the current limiting circuit, resistors R7, R8, R9, R10, R11, R12 and R13, capacitor C4, amplifier U2, and transistor Q2, produce a constant current signal, which is proportional to the command signal, through resistor R12. This constant current signal $I_{sp}$ also passes through resistor R2 such that the reference voltage signal is developed across resistor R2. It should be understood that control ground 32 may be at the same potential as power system ground 37 or at some other potential below that of line 34.

A first control power source 39 is connected to provide a 15 volt potential difference between high voltage line 34 and negative supply bus 40. A second control power source 41 provides 15 volt power, which is referenced to the control ground 32, for current limiting circuit 30. In operation, a comparator circuit 42, comprising resistors R15, R16, R17, R18 and R19, capacitors C5, C6 and C7, diodes, D4 and D5, amplifier U3 and transistor Q3, produces the control signal on line 22 in response to the difference signal appearing across capacitor C1.

In the bridge circuit, diode D3 and resistor R3 limit the magnitude of the reference voltage appearing across R2 by clamping the signal to the negative supply bus. This limiting action prevents loss of control in case of failure of the current source 30 such that the set point current, $I_{sp}$, increases beyond the rating of the unit. The charging action of diode D3 limits the voltage applied to resistors R2 and R3 and thus limits the maximum current limit setpoint.

The power controller is turned on by supplying a high level logic signal to terminal 44. This energizes the light emitting diode in optical coupler U4 causing its output to go high. The bias voltage across resistor R5 then goes to zero at the same time that the reference voltage across resistor R2 discharges to the programmed reference level. As capacitor C1 discharges to zero, amplifier U3 begins to drive the output transistor, Q1, turning on the output stage. When transistor Q1, is turned on, its drive current increases until the current sensed by shunt R1 equals the programmed current set point. Load current is then maintained at this level until the signal on terminal 44 is removed. If load resistance limits load current below the current limit setpoint, the control signal on line 22 will increase until transistor Q1 is saturated. If the load resistance is suddenly reduced, as in the case of a fault or overload, load current will increase only to the current limit set point.

As discussed above, the voltage produced across shunt R1 is combined with the voltage produced across resistor R2 in bridge circuit 28 to produce a difference signal across capacitor C1. This signal is fed to the inputs of amplifier U3 to produce an error signal at point 45. The error signal is current amplified by transistor Q3 to produce the control signal on line 22. This control signal is used by drive circuit 20 to control the operation of output transistor Q1. The gain of amplifier U3 is controlled by resistors R15 and R16 and capacitor C5 to ensure stable operation over the frequency bandwidth of the circuit. Capacitor C7 speeds up the turn off of transistor Q3 during suddenly applied overloads to limit overshoot of the current.

Clamping the current limit reference to a fixed level in the off state, as provided by diode D3 and resistor R3, provides control of switch turn-on and rise time independent of the programmed limit level. In particular, capacitor C2 serves as means for controlling the rate of change of the reference voltage signal from a preselected magnitude determined by the relative values of resistors R2 and R3, to the magnitude corresponding to the reference setpoint. The combination of optical coupler U4, diode D2 and resistor R4 serves as means for raising the biased voltage on resistor R5 above the programmed reference voltage across resistor R2. Resistor R3, diode D1 and optical coupler U4 combine to serve as means for reducing the voltage appearing across resistor R2 when the power controller is turned off.

Turn off is accomplished by applying a low level signal to terminal 44. A low level signal on terminal 44 causes the output of U4 to go low. Current through diode D2 and resistor R4 causes a voltage across resistor R5 in excess of the reference voltage across resistor R2. The optical coupler U4 also pulls down the reference voltage through diode D1 and resistor R3, regardless of the programmed current limit level. Therefore, in the off state, the difference voltage across capacitor C1 forces the output of amplifier U3 to a high level, thereby turning off transistor Q1.

The current limiting control circuit configuration illustrated in the drawing is compatible with various existing drive circuit and output stage combinations. Rise and fall times of the output stage transistor are controlled by circuit element time constants. The circuit also provides fast response time to overloads and limits current overshoots in the output stage.

Although the present invention has been described in terms of what is at present believed to be its preferred embodiment, it will be apparent to those skilled in the art that various changes may be made without departing from the scope of the invention. For example, although the command signal used to establish the current limit set point is a digital signal in the preferred embodiment, minor changes to the circuit could permit this signal to be an analog voltage signal, an analog current signal, a desired function of the input such as an inverse function of line voltage, or an output signal of a temperature sensor for limiting the temperature of a load. It is therefore intended that the appended claims cover such changes.

What is claimed is:

1. A current limited DC power controller comprising:
    an output circuit stage having a controllable solid state switching device for conducting current between a pair of output terminals;
    a drive circuit for controlling said solid state switching device in response to a control signal;
    a programmable current source for producing a reference current signal in response to a command signal;
    a first resistor for connection in series between a line voltage source and said programmable current source for producing a reference voltage signal, having a magnitude proportional to said command signal;
    means for clamping said reference voltage to a preselected magnitude when the power controller is off;
    means for producing a second voltage signal, having a magnitude proportional to current flowing through said output circuit stage;
    means for combining said reference voltage signal and said second voltage signal to produce a difference signal; and
    means for producing said control signal in response to said difference signal.

2. A power controller as recited in claim 1, further comprising:
    means for controlling the rate of change of said reference voltage signal from said preselected magnitude to said magnitude proportional to said reference current signal when said power controller is turned on.

3. A power controller as recited in claim 2, wherein said means for controlling the rate of change of said reference voltage comprises:
    a capacitor electrically connected in parallel with said first resistor.

4. A power controller as recited in claim 1, further comprising:
    a first control power source connected between said line voltage source and a negative control bus; and
    said clamping means including a second resistor electrically connected in series with said first resistor, and means for connecting one end of said second resistor to said negative control bus.

5. A power controller as recited in claim 1, further comprising:
    means for adding a bias voltage to said second voltage signal when said power controller is off.

6. A power controller as recited in claim 1, further comprising:
    a second control power source providing control voltage between said current source and a control ground.

7. A power controller as recited in claim 6, wherein: said control ground is common with a power system ground.

* * * * *